United States Patent
Chow et al.

(10) Patent No.: US 7,871,862 B2
(45) Date of Patent: Jan. 18, 2011

(54) BALL GRID ARRAY PACKAGE STACKING SYSTEM

(75) Inventors: Seng Guan Chow, Singapore (SG); Lionel Chien Hui Tay, Singapore (SG)

(73) Assignee: Stats Chippac Ltd., Singapore (SG)

( * ) Notice: Subject to any disclaimer, the term of this patent is extended or adjusted under 35 U.S.C. 154(b) by 100 days.

(21) Appl. No.: 12/206,383

(22) Filed: Sep. 8, 2008

(65) Prior Publication Data

US 2010/0059873 A1  Mar. 11, 2010

(51) Int. Cl.
H01L 21/50 (2006.01)
H01L 21/48 (2006.01)
H01L 21/44 (2006.01)
H01L 23/34 (2006.01)
H01L 23/02 (2006.01)
H01L 23/36 (2006.01)

(52) U.S. Cl. .................. 438/122; 438/121; 438/109; 257/706; 257/686; 257/E23.101

(58) Field of Classification Search .............. 438/122, 438/121, 109; 257/686, 706, E23.101
See application file for complete search history.

(56) References Cited

U.S. PATENT DOCUMENTS

| | | | | |
|---|---|---|---|---|
| 5,430,611 A | * | 7/1995 | Patel et al. ............... | 361/705 |
| 5,477,082 A | * | 12/1995 | Buckley et al. ............ | 257/679 |
| 6,442,026 B2 | * | 8/2002 | Yamaoka .................. | 361/704 |
| 6,501,164 B1 | * | 12/2002 | Chen et al. ................ | 257/686 |
| 6,537,848 B2 | | 3/2003 | Camenforte et al. | |
| 6,678,167 B1 | * | 1/2004 | Degani et al. ............. | 361/760 |
| 6,683,795 B1 | | 1/2004 | Yoo | |
| 6,809,937 B2 | * | 10/2004 | Augustin et al. .......... | 361/832 |
| 6,853,070 B2 | | 2/2005 | Khan et al. | |
| 6,984,785 B1 | | 1/2006 | Diao et al. | |
| 7,241,645 B2 | | 7/2007 | Zhao et al. | |
| 7,312,108 B2 | | 12/2007 | Zhao et al. | |
| 7,315,078 B2 | | 1/2008 | Huang | |
| 7,315,079 B2 | | 1/2008 | Zhou et al. | |
| 7,462,933 B2 | | 12/2008 | Zhao et al. | |
| 7,495,321 B2 | * | 2/2009 | Do et al. ................... | 257/666 |
| 7,566,590 B2 | | 7/2009 | Zhong et al. | |
| 2005/0277227 A1 | | 12/2005 | Shim et al. | |
| 2006/0103010 A1 | | 5/2006 | Kim et al. | |
| 2009/0236733 A1 | | 9/2009 | Chow et al. | |
| 2009/0309204 A1 | * | 12/2009 | Ha .......................... | 257/686 |

* cited by examiner

*Primary Examiner*—Luan C Thai
(74) *Attorney, Agent, or Firm*—Mikio Ishimaru

(57) ABSTRACT

A ball grid array package stacking system includes: forming a heat spreader having a centrally located access port; mounting a substrate in the heat spreader for providing a connection pad in the centrally located access port; coupling an integrated circuit die to the substrate; and coupling a system interconnect to the integrated circuit die, the connection pad, or a combination thereof.

20 Claims, 5 Drawing Sheets

BALL GRID ARRAY PACKAGE STACKING SYSTEM

CROSS-REFERENCE TO RELATED APPLICATION(S)

The present application contains subject matter related to a co-pending U.S. patent application Ser. No. 12/050,400 filed Mar. 18, 2008. The related application is assigned to STATS ChipPAC Ltd.

TECHNICAL FIELD

The present invention relates generally to integrated circuit packaging, and more particularly to a system for enhancing the capabilities of ball grid array packaging.

BACKGROUND ART

A number of different packaging technologies exist for attaching semiconductor devices to a printed circuit board (PCB). Many of today's consumer electronic devices, such as personal video players, video games and hand held computers require a high density of integrated circuits mounted on the PCB. The three packaging technologies include a ball grid array (BGA), chip scale package (CSP), and direct chip attach (DCA). BGA is an older technology relative to CSP and DCA. Theoretically speaking, the most effective packaging technology is DCA. DCA involves the direct attachment of the chip to the PCB without a package, such as a solder-bumped flip chip or wire bonding chip on the board. Issues with respect to the cost of supplying a known good die (KGD) and corresponding fine line and spacing PCB are present. As a result, CSP's and BGA's are the main types of packaging technology used in attaching semiconductors to PCB's.

As the demand for high speed, high performance, and low cost, semiconductor devices are continually increasing in integration density, packages have become more complex. For example, packages are present in which multiple chips are placed within a single package. These types of chips are also referred to as multi-chip modules. A multi-chip module (MCM), also referred to as a multi-chip package (MCP), contains two or more die in a single package. These multi-chip modules may contain microprocessor circuits along with peripheral circuits, such as memory management units, input/output controllers, peripheral component interconnect or interface (PCI) controllers, and application specific integrated circuits (ASIC).

The most common MCM is a "side-by-side" MCM. In this type of MCM, two or more die are mounted next to each other on the mounting surface of either a plastic molded package, cavity package, or a chip on board (COB) assembly. The die may be mounted directly to the mounting surface or be mounted on a substrate, which is itself mounted to the principle-mounting surface. Inner connections among these die and electrical leads are commonly made via wire bonding. Other MCM's involve placing two or more die on top of each other and securing the "stack" of die in a package.

One problem with placing multiple die within a single package is with additional die, additional possible defects are possible within the package. If one die within an MCM is defective, the entire chip must then be discarded. Thus, although MCM's have provided increased functionality, yields have decreased as a result of the increased chances for defects.

Thus, a need still remains for a ball grid array package stacking system. In view of the increasing demand for more circuit function in limited space, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a ball grid array package stacking system including: forming a heat spreader having a centrally located access port; mounting a substrate in the heat spreader for providing a connection pad in the centrally located access port; coupling an integrated circuit die to the substrate; and coupling a system interconnect to the integrated circuit die, the connection pad, or a combination thereof.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
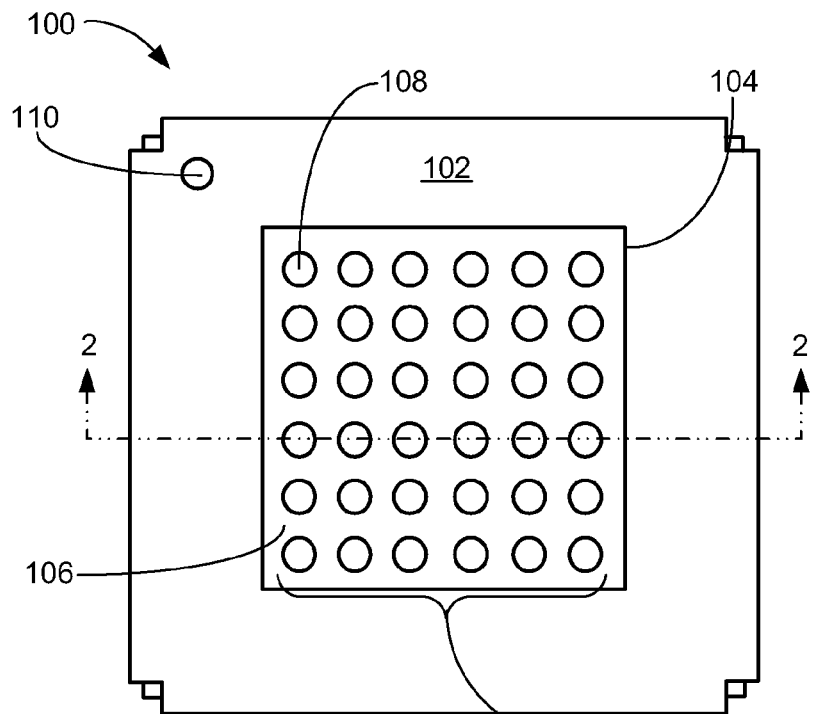
FIG. 1 is a top view of a ball grid array package stacking system, in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the heat sink, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" as used herein means and refers to the method and to the apparatus of the present invention in accordance with the context in which the term is used. The term "processing" as used herein includes stamping, forging, patterning, exposure, development, etching, cleaning, and/or removal of the material or laser trimming as required in forming a described structure.

Referring now to FIG. 1, therein is shown a top view of a ball grid array package stacking system 100, in an embodiment of the present invention. The top view of the ball grid array package stacking system 100 depicts a heat spreader 102, such as an electrically and thermally conductive material, having a centrally located access port 104. A substrate 106, such as a laminate substrate, a thin film substrate, a flex circuit substrate, or the like, may be positioned beneath the heat spreader 102 to align a connection pad 108 within the centrally located access port 104. A pin one indicator 110 may be used for optical alignment during assembly of the next level system (not shown). An array 112 of the connection pads 108 may be positioned within the centrally located access port 104. The number and position of the connection pads 108 in the array 112 is an example only and the actual number and position may vary. A section line 2-2 shows the position and direction of view for FIG. 2.

The size, position, and shape of the centrally located access port 104 are by way of an example only. The actual size, position, and shape may differ. The heat spreader 102 may be electrically connected to the reference voltage for the ball grid array package stacking system 100. In this configuration, the heat spreader 102 may act as an electro-magnetic interference (EMI) shield. The heat spreader 102 may act as a stiffener, for a thin packaged ball grid array, in order to maintain co-planarity and prevent warping of the thin packaged ball grid array.

Figure 2:
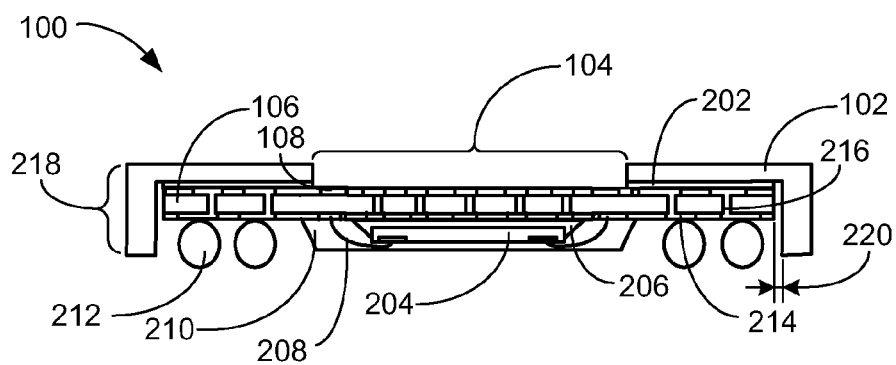
FIG. 2 is a cross-sectional view of the ball grid array package stacking system, of FIG. 1, along the section line 2-2.

Referring now to FIG. 2, therein is shown a cross-sectional view of the ball grid array package stacking system 100, of FIG. 1, along the section line 2-2. The cross-sectional view of the ball grid array package stacking system 100 depicts the heat spreader 102 having the substrate 106 attached by an insulating adhesive 202, such as a thermally conductive and electrically isolating adhesive. The connection pad 108 may be positioned in the centrally located access port 104 for further connection. An integrated circuit die 204 may be mounted to the substrate 106 by an adhesive 206, such as a die attach material. The adhesive 206 may be both thermally and electrically conductive to form a reference voltage connection, such as ground connection, between the integrated circuit die 204 and the substrate 106.

An electrical interconnect 208, such as a bond wire, may couple the integrated circuit die 204 to the substrate 106. A molded cap 210, such as an epoxy molded cap, may be formed on the integrated circuit die 204, the substrate 106, and the electrical interconnect 208. A system interconnect 212, such as a solder ball, solder bump, solder column, or stud bump, may be coupled to a system pad 214 on the bottom of the substrate 106. The system interconnect 212 may be coupled to the system pad 214 positioned in rows that are adjacent to the heat spreader 102. A via 216 may couple the system pad 214 to the connection pad 108. The heat spreader 102 may include standoff legs 218 that may be used to control the collapse height of the system interconnect 212 during the assembly reflow process.

The number and position of the system interconnect 212 is by way of an example only. The actual number and position of the system interconnect 212 may differ. A gap 220 may be provided between the standoff legs 218 and the substrate 106 in order to prevent possible short circuits.

In an alternative approach an insulating layer, such as an oxide coating, may coat the inside of the heat spreader 102 to act as an insulator. This alternative approach may electrically isolate the heat spreader 102 from the substrate 106. The insulating layer may be applied to the side wall of the centrally located access port 104 as well.

Figure 3:
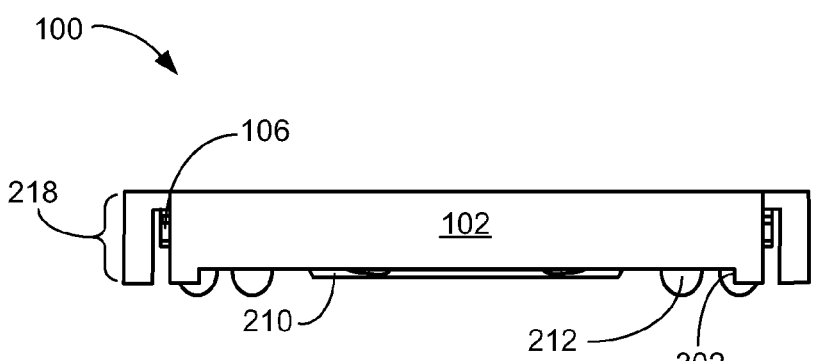
FIG. 3 is a side view of the ball grid array package stacking system, of FIG. 1.

Referring now to FIG. 3, therein is shown a side view of the ball grid array package stacking system 100, of FIG. 1. The side view of the ball grid array package stacking system 100 depicts the heat spreader 102 having the standoff legs 218 with a clearance step 302 for providing a space between the heat spreader 102 and the next level system, not shown. The substrate 106 may protrude between the standoff legs 218 at the corners of the heat spreader 102.

The molded cap 210 may be visible beneath the clearance step 302, but this is an example only. In the actual implementation the size of the clearance step 302 may differ. The system interconnect 212 will protrude beneath the standoff legs 218, but their number and position may differ.

Figure 4:
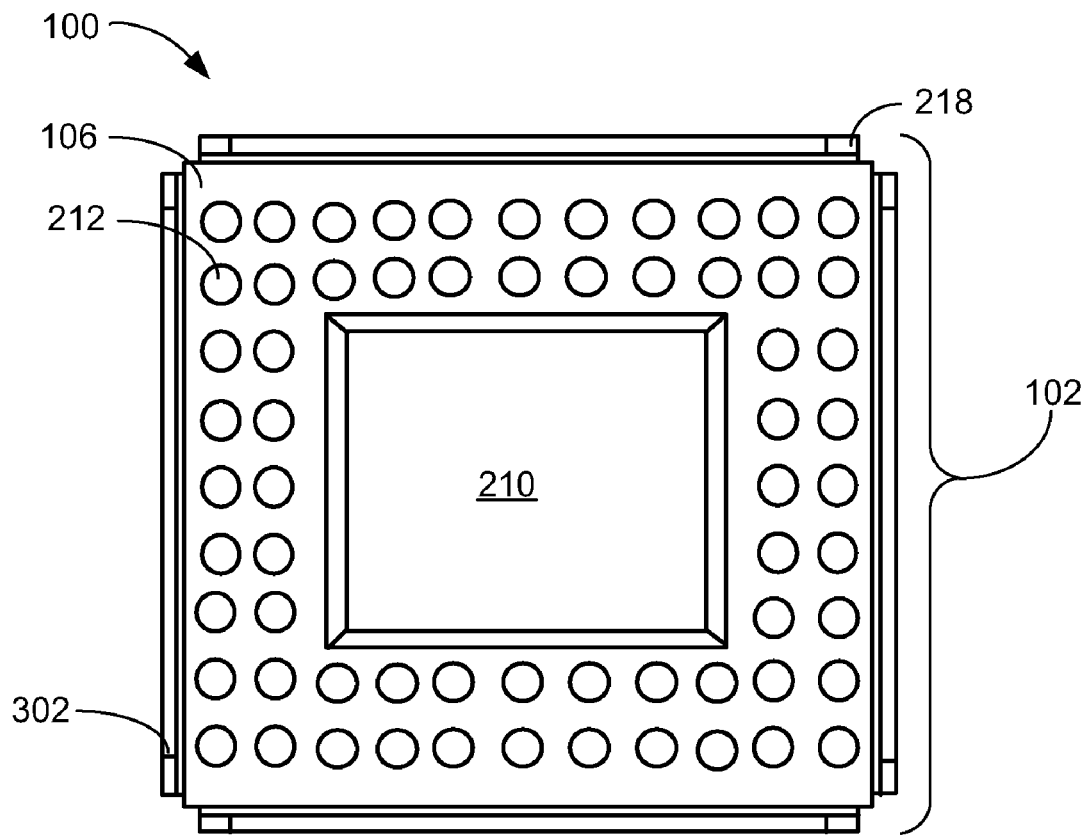
FIG. 4 is a bottom view of the ball grid array package stacking system, of FIG. 1.

Referring now to FIG. 4, therein is shown a bottom view of the ball grid array package stacking system 100, of FIG. 1. The bottom view of the ball grid array package stacking system 100 depicts the heat spreader 102 having the standoff legs 218 and the clearance step 302. The substrate 106 may be positioned within the heat spreader 102. The system interconnects 212 may be positioned around the molded cap 210. The number and position of the system interconnects 212 is an example only and the actual number and position may vary. The size and shape of the molded cap is also an example and may differ in the actual implementation.

Figure 5:
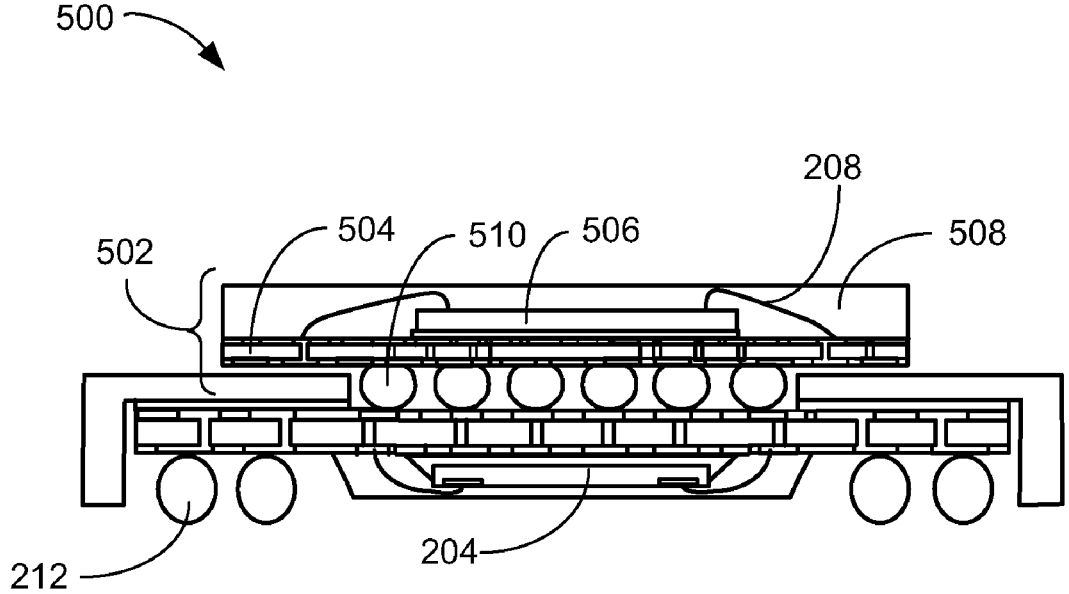
FIG. 5 is a cross-sectional view of a package stack, in a first application of the present invention.

Referring now to FIG. 5, therein is shown a cross-sectional view of a package stack 500, in a first application of the present invention. The cross-sectional view of the package stack 500 depicts a stacked package 502 having a package substrate 504. A stacked integrated circuit 506, such as a ball grid array, a leadless package, or a leaded package, may be mounted thereon. The electrical interconnect 208 may couple the stacked integrated circuit 506 to the package substrate 504. A molded body 508 may be formed on the package substrate 504, the stacked integrated circuit 506, and the electrical interconnects 208. Chip interconnects 510, such as solder balls, solder bumps, solder columns, or stud bumps, may form an electrical connection between the stacked integrated circuit 506, the integrated circuit die 204, the system interconnects 212, or a combination thereof.

Figure 6:
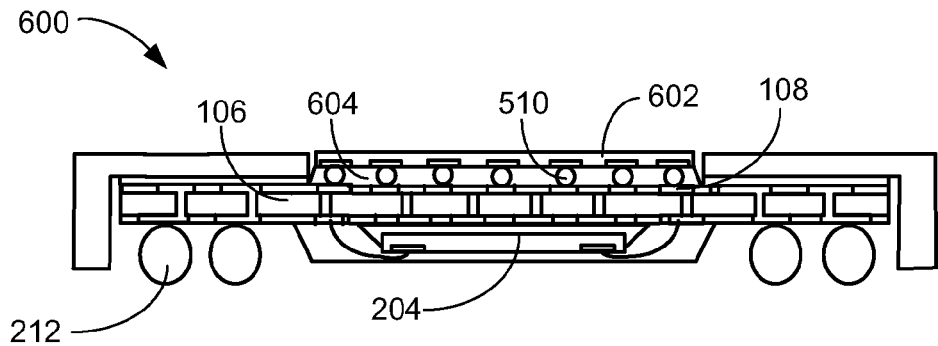
FIG. 6 is a cross-sectional view of a package stack, in a second application of the present invention.

Referring now to FIG. 6, therein is shown a cross-sectional view of a package stack 600, in a second application of the present invention. The cross-sectional view of the package stack 600 depicts a stacked die 602, such as a flip chip integrated circuit die, coupled to the connection pad 108 by the chip interconnects 510. An electrical connection may be made between the stacked die 602, the integrated circuit die 204, the system interconnect 212, or a combination thereof. A sealing material 604, such as an underfill material, may be applied between the stacked die 602 and the substrate 106 for protecting the chip interconnects 510. The number and position of the chip interconnects and the shape of the stacked die 602 is an example only and may differ in the actual implementation.

Figure 7:
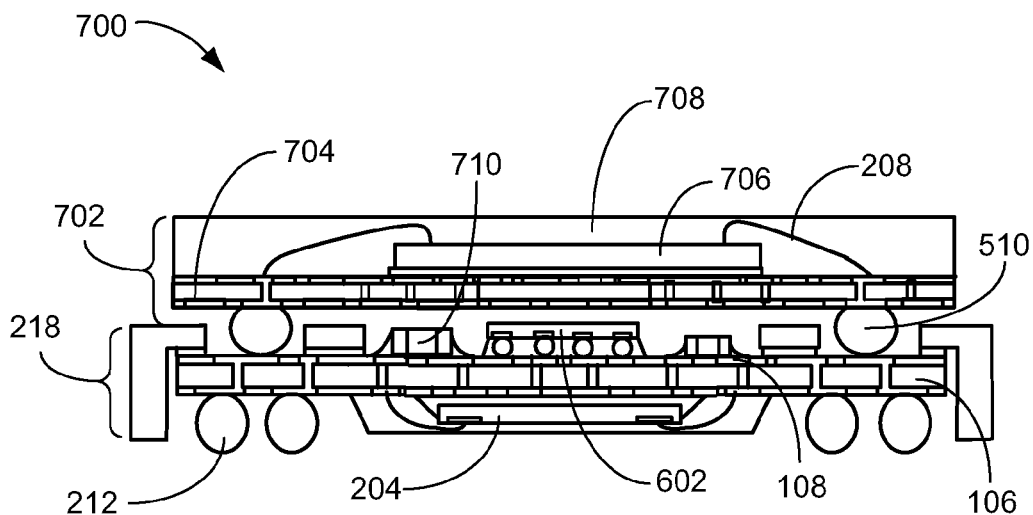
FIG. 7 is a cross-sectional view of a package stack, in a third application of the present invention.

Referring now to FIG. 7, therein is shown a cross-sectional view of a package stack 700, in a third application of the present invention. The cross-sectional view of the package stack 700 depicts a stacked package 702 having a stacked substrate 704 with a stacked integrated circuit 706 mounted thereon. The electrical interconnects 208 couple the stacked integrated circuit 706 to the stacked substrate 704. A package body 708 may be formed on the stacked substrate 704, the stacked integrated circuit 706, and the electrical interconnects 208. The chip interconnects 510 may form an electrical connection between the stacked package 702 and the substrate 106.

The stacked die 602 may be coupled to the substrate 106, between the stacked package 702 and the substrate 106, by the chip interconnects 510. A discrete component 710, such as a resistor, capacitor, inductor, diode, voltage regulator, transistor, or the like, may be coupled to the substrate 106 in the area of the stacked die 602. An electrical connection may be formed between the stacked die 602, the stacked integrated circuit 706, the integrated circuit die 204, the discrete component 710, the system interconnect 212, or a combination thereof.

The number, size, and position of the discrete components 710 is an example only and the actual number, size, and position may differ. The size and position of the stacked die 602 is also an example and may differ in the actual implementation. The stacked package 702 is shown with a number of the chip interconnects 510 that may differ in the actual implementation. While the discrete components 710 are shown with only two contacts coupled to the connection pads 108, more connections are possible.

Figure 8:
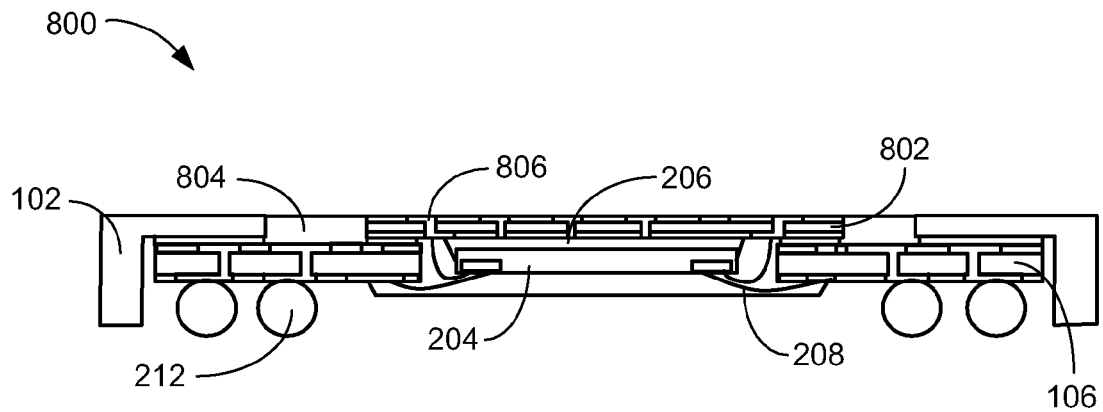
FIG. 8 is a cross-sectional view of a ball grid array package stacking system, in an alternative embodiment of the present invention.

Referring now to FIG. 8, therein is shown a cross-sectional view of a ball grid array package stacking system 800, in an alternative embodiment of the present invention. The cross-sectional view of the ball grid array package stacking system 800 depicts the heat spreader 102 having a mounted substrate 802 positioned over an opening in the substrate 106. The integrated circuit die 204 may be adhered to the mounted substrate 802 by the adhesive 206. The electrical interconnects 208 may form a connection between the integrated circuit die 204, the mounted substrate 802, the substrate 106, or a combination thereof.

A molded filler 804 may be formed around the mounted substrate 802. A connection pad 806 may be formed on the exposed surface of the mounted substrate 802. The system interconnect 212 may be coupled to the substrate 106 for providing an electrical connection between the integrated circuit die 204, the connection pad 806, or a combination thereof.

Figure 9:
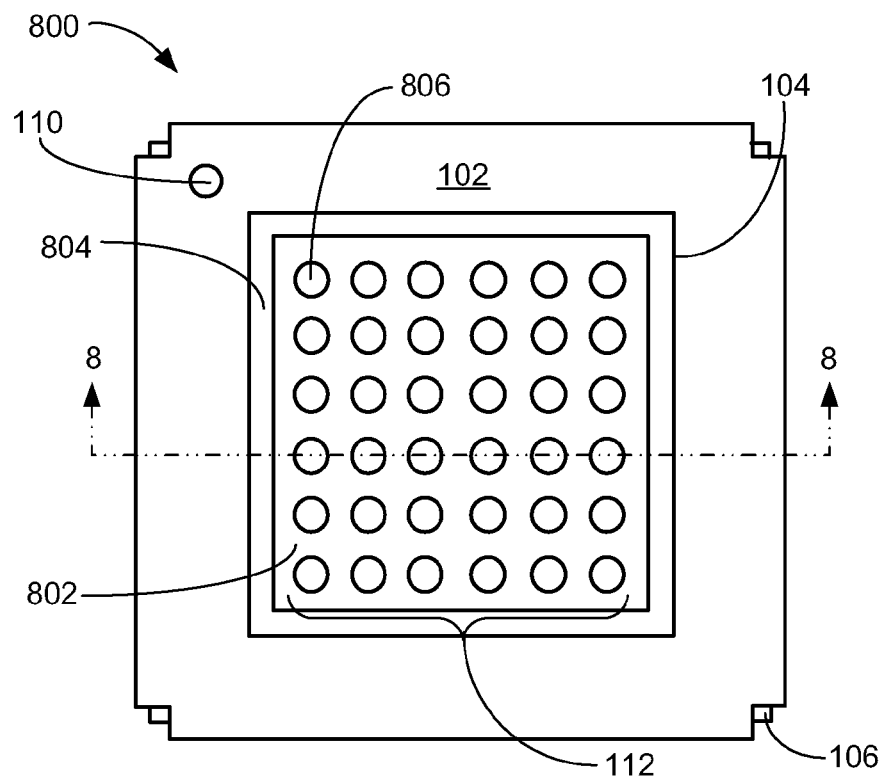
FIG. 9 is a top view of the ball grid array package stacking system, of FIG. 8.

Referring now to FIG. 9, therein is shown a top view of the ball grid array package stacking system 800, of FIG. 8. The top view of the ball grid array package stacking system 800 depicts the heat spreader 102, such as an electrically and thermally conductive material, having the centrally located access port 104. The mounted substrate 802, such as a laminate substrate, a thin film substrate, a flex circuit substrate, or the like, may be positioned within the centrally located access port 104. The molded filler 804, such as an epoxy molding compound, may be formed around the mounted substrate 802. The substrate 106 may be visible in the corners of the heat spreader 102. The pin one indicator 110 may be used for optical alignment during assembly of the next level system (not shown). The array 112 of the connection pads 806 may be positioned within the centrally located access port 104. The number and position of the connection pads 806 in the array 112 is an example only and the actual number and position may vary. A section line 8-8 shows the position and direction of view for FIG. 8.

The size, position, and shape of the centrally located access port 104 are by way of an example only. The actual size, position, and shape may differ. The heat spreader 102 may be electrically connected to the reference voltage for the ball grid array package stacking system 100. In this configuration, the heat spreader 102 may act as an electro-magnetic interference (EMI) shield. The heat spreader 102 may act as a stiffener, for a thin packaged ball grid array, in order to maintain co-planarity and prevent warping of the thin packaged ball grid array.

Figure 10:
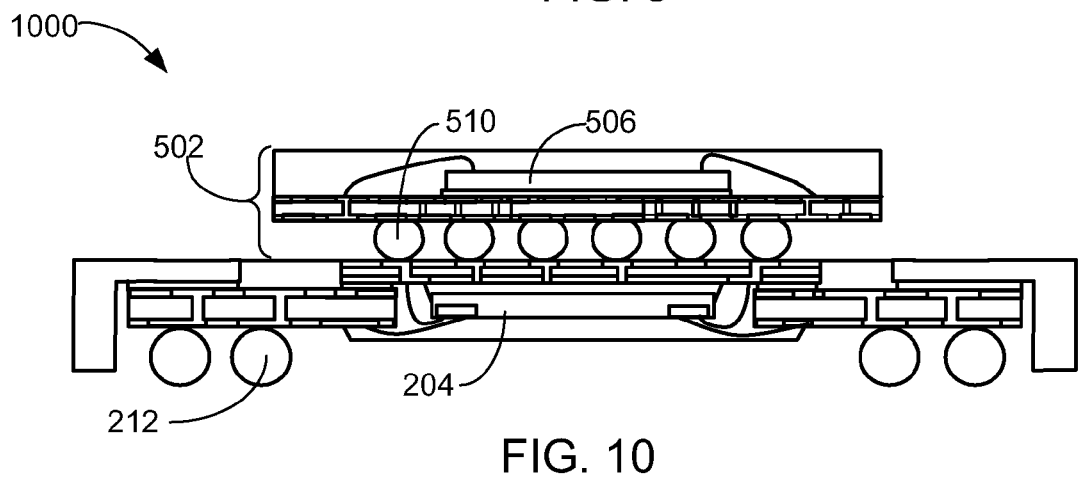
FIG. 10 is a cross-sectional view of a package stack, in a first application of alternative embodiment of the present invention.

Referring now to FIG. 10, therein is shown a cross-sectional view of a package stack 1000, in a first application of alternative embodiment of the present invention. The cross-sectional view of the package stack 1000 depicts the stacked package 502 coupled to the connection pads 806 by the chip interconnects 510. An electrical connection may be formed between the stacked integrated circuit 506, the integrated circuit die 204, the system interconnects 212, or a combination thereof.

Figure 11:
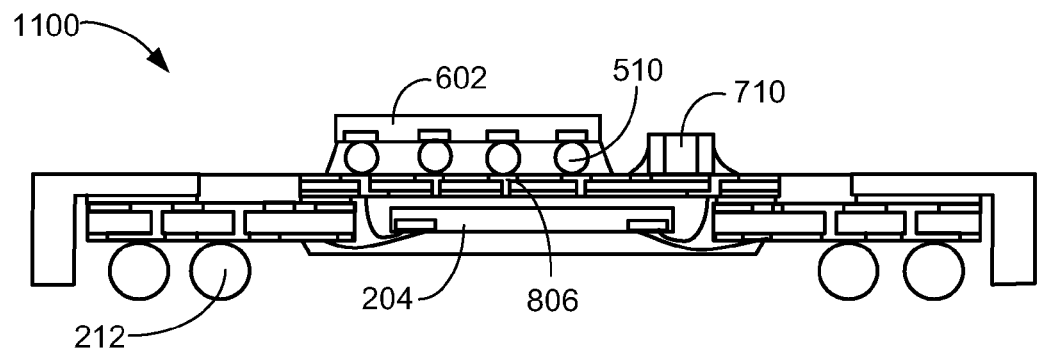
FIG. 11 is a cross-sectional view of a package stack, in a second application of alternative embodiment of the present invention.

Referring now to FIG. 11, therein is shown a cross-sectional view of a package stack 1100, in a second application of alternative embodiment of the present invention. The cross-sectional view of the package stack 1100 depicts the stacked die 602 coupled to the connection pads 806 by the chip interconnects 510. The discrete component 710 may be mounted on the connection pads 806 as well. An electrical connection may be formed between the stacked die 602, the discrete component 710, the integrated circuit die 204, the system interconnects 212, or a combination thereof.

Figure 12:
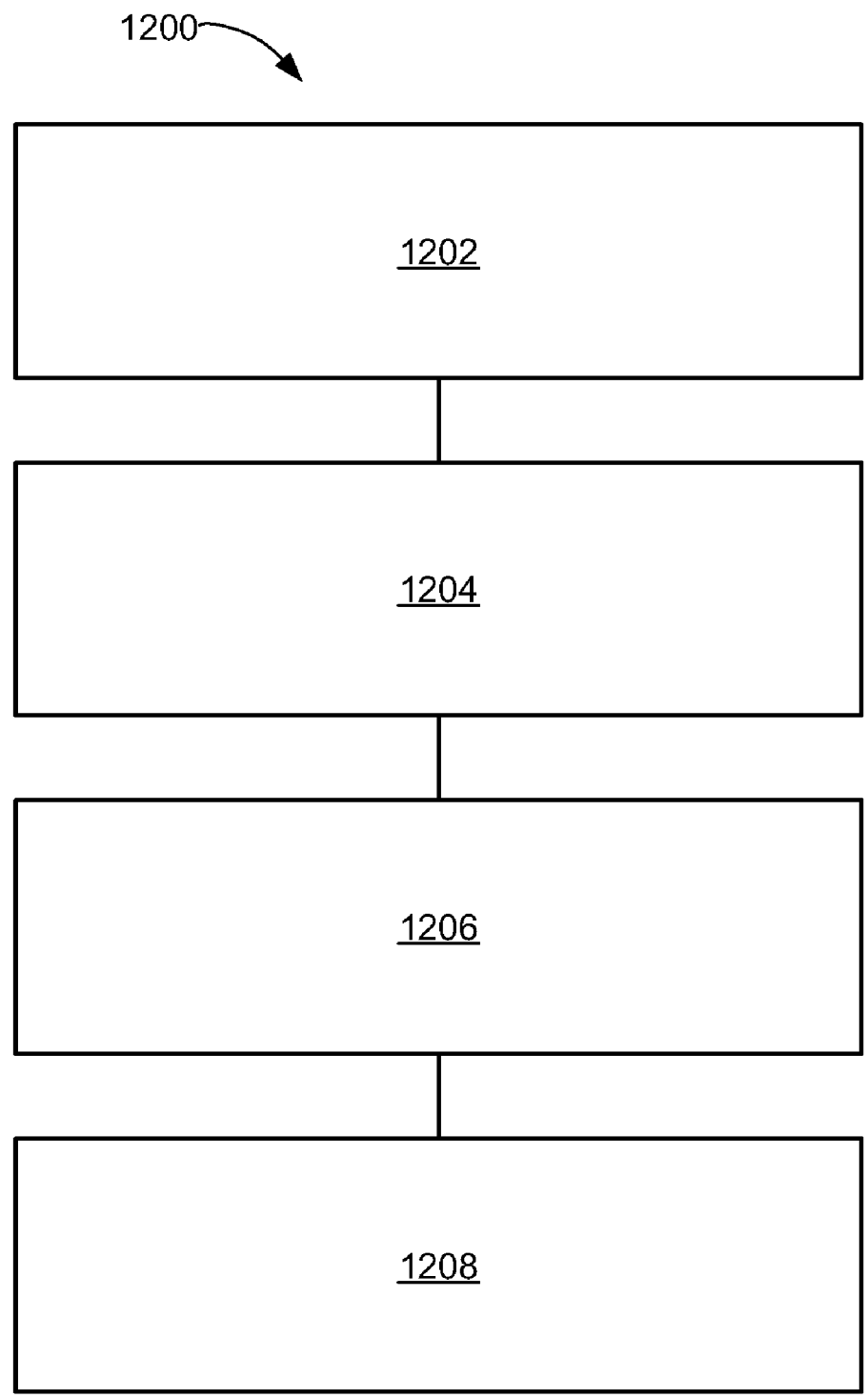
FIG. 12 is a flow chart of a ball grid array package stacking system for manufacturing the ball grid array package stacking system, in an embodiment of the present invention.

Referring now to FIG. 12, therein is shown a flow chart of a ball grid array package stacking system 1200 for manufacturing the ball grid array package stacking system 100 in an embodiment of the present invention. The system 1200 includes forming a heat spreader having a centrally located access port in a block 1202; mounting a substrate in the heat spreader for providing a connection pad in the centrally located access port in a block 1204; coupling an integrated circuit die to the substrate in a block 1206; and coupling a system interconnect to the integrated circuit die, the connection pad, or a combination thereof in a block 1208.

It has been discovered that the present invention thus has numerous aspects.

An aspect that has been unexpectedly discovered is that the present invention may provide a package stacking mechanism that can act as an EMI shield as well as a heat spreader.

Another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the ball grid array package stacking system of the present invention furnishes important and heretofore unknown and unavailable solutions, capabilities, and functional aspects for stacking integrated circuits with enhanced thermal performance. The resulting processes and configurations are straightforward, cost-effective, uncomplicated, highly versatile and effective, can be surprisingly and unobviously implemented by adapting known technologies, and are thus readily suited for efficiently and economically manufacturing stacked integrated circuit devices fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing a ball grid array package stacking system comprising:
    forming a heat spreader having a standoff leg and a centrally located access port;
    mounting a substrate in the heat spreader for providing a connection pad in the centrally located access port, and with a gap between the substrate and the standoff leg of the heat spreader;
    coupling an integrated circuit die to the substrate; and
    coupling a system interconnect through a system pad, on a bottom of the substrate and adjacent to the heat spreader, to the integrated circuit die, the connection pad, or a combination thereof.

2. The method as claimed in claim 1 further comprising coupling a stacked package to the connection pad.

3. The method as claimed in claim 1 further comprising coupling a stacked die to the connection pad.

4. The method as claimed in claim 1 further comprising coupling a discrete component to the connection pad.

5. The method as claimed in claim 1 further comprising positioning a mounted substrate in the centrally located access port.

6. A method of manufacturing a ball grid array package stacking system comprising:
    forming a heat spreader having a centrally located access port including forming a standoff leg;
    mounting a substrate in the heat spreader for providing a connection pad in the centrally located access port including forming an array of the connection pads, and with a gap between the substrate and the standoff leg of the heat spreader;
    coupling an integrated circuit die to the substrate including connecting an electrical interconnect between the integrated circuit die and the substrate; and
    coupling a system interconnect through a system pad, on a bottom of the substrate and adjacent to the heat spreader, to the integrated circuit die, the connection pad, or a combination thereof including coupling a solder ball, a solder bump, a solder column, or a stud bump.

7. The method as claimed in claim 6 further comprising coupling a stacked package to the connection pad for forming a package stack including coupling a stacked integrated circuit, the integrated circuit die, the system interconnect, or a combination thereof.

8. The method as claimed in claim 6 further comprising coupling a stacked die to the connection pad including applying a sealing material between the stacked die and the substrate.

9. The method as claimed in claim 6 further comprising coupling a discrete component to the connection pad including coupling a resistor, a capacitor, an inductor, a diode, a transistor, or a voltage regulator to the integrated circuit die, the system interconnect, or a combination thereof.

10. The method as claimed in claim 6 further comprising positioning a mounted substrate in the centrally located access port including forming a molded filler, in the centrally located access port, between the mounted substrate and the heat spreader.

11. A ball grid array package stacking system comprising:
    a heat spreader having a standoff leg and a centrally located access port;
    a substrate mounted in the heat spreader for providing a connection pad in the centrally located access port, and with a gap between the substrate and the standoff leg of the heat spreader;
    an integrated circuit die coupled to the substrate; and
    a system interconnect coupled through a system pad, on a bottom of the substrate and adjacent to the heat spreader, to the integrated circuit die, the connection pad, or a combination thereof.

12. The system as claimed in claim 11 further comprising a stacked package coupled to the connection pad.

13. The system as claimed in claim 11 further comprising a stacked die coupled to the connection pad.

14. The system as claimed in claim 11 further comprising a discrete component coupled to the connection pad.

15. The system as claimed in claim 11 further comprising a mounted substrate positioned in the centrally located access port.

16. The system as claimed in claim 11 further comprising:
    an array of the connection pads in the centrally located access port;
    an electrical interconnect between the integrated circuit die and the substrate; and
    a solder ball, a solder bump, a solder column, or a stud bump coupled to the integrated circuit die, the connection pad, or a combination thereof.

17. The system as claimed in claim 16 further comprising a stacked package coupled to the connection pad to form a package stack includes a stacked integrated circuit, the integrated circuit die, the system interconnect, or a combination thereof electrically connected.

18. The system as claimed in claim 16 further comprising a stacked die coupled to the connection pad includes a sealing material between the stacked die and the substrate.

19. The system as claimed in claim 16 further comprising a discrete component coupled to the connection pad includes a resistor, a capacitor, an inductor, a diode, a transistor, or a voltage regulator coupled to the integrated circuit die, the system interconnect, or a combination thereof.

20. The system as claimed in claim 16 further comprising a mounted substrate positioned in the centrally located access port includes a molded filler, formed in the centrally located access port, between the mounted substrate and the heat spreader.

* * * * *